(12) United States Patent
Nishijima et al.

(10) Patent No.: US 8,987,853 B2
(45) Date of Patent: Mar. 24, 2015

(54) LIGHT EMITTING DEVICE AND METHOD OF MANUFACTURING THE LIGHT EMITTING DEVICE

(71) Applicant: Nichia Corporation, Anan-shi (JP)

(72) Inventors: Shinji Nishijima, Kyoto (JP); Tomohide Miki, Tokushima (JP); Hiroto Tamaki, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 14/152,712

(22) Filed: Jan. 10, 2014

(65) Prior Publication Data

US 2014/0191278 A1 Jul. 10, 2014

Related U.S. Application Data

(63) Continuation of application No. 13/258,316, filed as application No. PCT/JP2010/069144 on Oct. 28, 2010, now Pat. No. 8,659,106.

(30) Foreign Application Priority Data

Oct. 29, 2009 (JP) .................. 2009-248820

(51) Int. Cl.
*H01L 31/0203* (2014.01)
*H01L 23/495* (2006.01)
(Continued)

(52) U.S. Cl.
CPC ............ *H05K 5/0091* (2013.01); *H01L 33/486* (2013.01); *H01L 33/52* (2013.01);
(Continued)

(58) Field of Classification Search
USPC ........... 257/100, 432, 433, 666, 787, E25.032
See application file for complete search history.

(56) References Cited

U.S. PATENT DOCUMENTS 6,930,332 B2  8/2005  Hashimoto et al.
7,824,937 B2  11/2010  Suehiro et al.
(Continued)

FOREIGN PATENT DOCUMENTS

JP  2003-282955  10/2003
JP  2004-228531   8/2004
(Continued)

OTHER PUBLICATIONS

International Search Report dated Jan. 25, 2011, PCT/JP2010/069144.
(Continued)

*Primary Examiner* — Nitin Parekh
(74) *Attorney, Agent, or Firm* — Foley & Lardner LLP (57) ABSTRACT

A light emitting device includes a base body forming a recess defined by a bottom surface and a side wall thereof, a conductive member whose upper surface being exposed in the recess and whose lower surface forming an outer surface, a protruding portion disposed in the recess, a light emitting element mounted in the recess and electrically connected to the conductive member, and a sealing member disposed in the recess to cover the light emitting element. The base body has a bottom portion and a side wall portion integrally formed of a resin, an inner surface of the side wall portion is the side wall defining the recess and has a curved portion, and the protruding portion is disposed in close vicinity to the curved surface. With this arrangement, a thin and small-sized light emitting device excellent in light extraction efficiency and reliability can be obtained.

7 Claims, 4 Drawing Sheets (51) Int. Cl.
    *H05K 5/00*     (2006.01)
    *H01L 33/48*     (2010.01)
    *H01L 33/52*     (2010.01)
    *H01L 33/60*     (2010.01)

(52) U.S. Cl.
    CPC ...... *H01L 33/60* (2013.01); *H01L 2224/48091* (2013.01); *H01L 2224/48247* (2013.01); *H01L 2224/48465* (2013.01); *H01L 2924/01322* (2013.01); *H01L 2924/3011* (2013.01); *H01L 2924/3025* (2013.01)
    USPC ............. 257/433; 257/99; 257/100; 257/432; 257/666; 257/787; 257/E25.032

(56) References Cited

U.S. PATENT DOCUMENTS

| | | | |
|---|---|---|---|
| 8,445,928 B2 * | 5/2013 | Cheng et al. | 257/98 |
| 2001/0000622 A1 * | 5/2001 | Reeh et al. | 257/98 |
| 2001/0042865 A1 * | 11/2001 | Oshio et al. | 257/100 |
| 2003/0025117 A1 | 2/2003 | Isokawa et al. | |
| 2003/0168720 A1 | 9/2003 | Kamada | |
| 2003/0189830 A1 | 10/2003 | Sugimoto et al. | |
| 2004/0159850 A1 | 8/2004 | Takenaka | |
| 2005/0045903 A1 | 3/2005 | Abe et al. | |
| 2005/0072981 A1 | 4/2005 | Suenaga | |
| 2006/0022215 A1 | 2/2006 | Arndt et al. | |
| 2006/0034084 A1 | 2/2006 | Matsuura et al. | |
| 2006/0043407 A1 | 3/2006 | Okazaki | |
| 2006/0043879 A1 | 3/2006 | Naitou | |
| 2006/0102918 A1 | 5/2006 | Su et al. | |
| 2008/0054287 A1 | 3/2008 | Oshio et al. | |
| 2009/0065793 A1 | 3/2009 | Hon et al. | |
| 2010/0133560 A1 | 6/2010 | Kim et al. | |
| 2010/0155739 A1 | 6/2010 | Kuramoto et al. | |

FOREIGN PATENT DOCUMENTS

| | | |
|---|---|---|
| JP | 2005-079329 | 3/2005 |
| JP | 2005-310680 | 11/2005 |
| JP | 2005-311153 | 11/2005 |
| JP | 2006-156704 | 6/2006 |
| JP | 2009-070870 | 4/2009 |
| WO | WO-2004/068594 A1 | 8/2004 |
| WO | WO 2007/015426 A1 | 2/2007 |

OTHER PUBLICATIONS

Extended European Search Report dated Oct. 14, 2014 issued in Application No. 10826804.6.

* cited by examiner

LIGHT EMITTING DEVICE AND METHOD OF MANUFACTURING THE LIGHT EMITTING DEVICE

CROSS-REFERENCE TO RELATED APPLICATIONS

This application is a continuation of and claims priority to U.S. application Ser. No. 13/258,316, filed Sep. 21, 2011, which is a U.S. National Phase of PCT/JP2010/069144, filed Oct. 28, 2010, which claims priority from Japanese Patent Application No. 2009-248820, filed Oct. 29, 2009. The subject matter of each of the above-referenced applications is incorporated in its entirety by reference.

BACKGROUND OF THE INVENTION

1. Technical Field

The present invention relates to a resin package and a method of manufacturing the resin package, which is usable for a light emitting device applicable to image apparatus, lighting equipment, display, backlight source for liquid crystal display, or the like, and particularly to the resin package of thin and small type with high reliability, the light emitting device using the resin package and a method of manufacturing the light emitting device.

2. Background Art

In compliance with the recent trend of reducing the size and weight of electronic devices, there have been developed various kinds of small sized light emitting devices (light emitting diodes) to be mounted on such an electronic device. Those light emitting devices employ, for example, a double-sided through-hole printed circuit board including an insulating substrate with a pair of metallic conductive patterns formed on each of the both sides of the insulating substrate. Such light emitting devices have a structure in which a light emitting element is mounted on the double-sided through-hole printed circuit board and the metallic conductive patterns and the optical semiconductor element are electrically connected using wires or the like.

However, such light emitting devices essentially require a double-sided through-hole printed circuit. Such a double-sided through-hole printed circuit board has a thickness of at least about 0.1 mm which becomes the obstructing factor for drastic reduction in thickness of surface-mount type light emitting devices. Furthermore, such substrates have poor processing accuracy compared to that of the resin packages, and thus to be unsuitable for down-sizing. For this reason, a light emitting device that does not contain such a printed-circuit has therefore been developed (for example as described in Patent Document 1).
Patent Document 1: JP 2005-79329A

DISCLOSURE OF INVENTION

Problems to be Solved by Invention

In the light emitting device disclosed in JP 2005-79329A, a thin metallic film is formed as an electrode on the substrate by using techniques such as vapor deposition, and is sealed with the light emitting element by an optically transmissive resin, and thus enables reduction in the thickness of the device compared to conventional surface-mounted light emitting devices.

However, only optically transmissive resin is used in this light emitting device, so that light from the light emitting element penetrates downward, which tends to result in reduction of light extracting efficiency. A structure having a conical metallic film to reflect light is also disclosed, but an irregularity is needed to be formed on the substrate to dispose such a metallic film. In that case, because the light emitting device has been reduced in size, the irregularity is necessarily microscopic, which not only hinders the processing but also tends to cause problems such that due to the irregular structure, the device becomes prone to break at the time when the substrate is removed and which leads decrease in the yield. In the case where the light emitting device is used in a display and the like, a problem also arises in that low contrast may result when only the optically transmissive resin is used. For this reason, a rim member may be attached to the metal film so that little light is allowed to penetrate, but the thickness increases accordingly. The present invention is devised to solve the problems described above, and a main object of the present invention is to provide a resin package of thin type with excellent light extraction efficiency, and a light emitting device using the resin package and a method of manufacturing the same.

Means to Solve the Problems

In order to solve the problems described above, a light emitting device according to the present invention includes a base body forming a recess defined by a bottom surface and a side wall thereof, a conductive member whose upper surface being exposed in the recess and whose lower surface forming an outer surface, a protruding portion disposed in the recess, a light emitting element mounted in the recess and electrically connected to the conductive member, and a sealing member disposed in the recess to cover the light emitting element. The base body has a bottom portion and a side wall portion integrally formed of a resin. The inner surface of the side wall portion is the side wall defining the recess and has a curved portion. The protruding portion is disposed in close vicinity to the curved surface. With this arrangement, a thin and small-sized light emitting device excellent in light extraction efficiency and reliability can be obtained.

The protruding portion may be disposed on the side surface defining the recess. The inner surface of the side wall portion defining the recess has a tilted portion at which the degree of tilt angle is inconstant, and the protruding portion may be disposed at the tilted portion. The protruding portion is preferably disposed on the curved portion of the inner surface defining the recess. Further, the protruding portion may be disposed on the inner surface of the side wall portion at a position closer to the bottom surface than to the upper surface. Alternatively, the protruding portions may be disposed in a plural number in the recess in a height direction or in a horizontal direction.

Besides, the inner surface of the side wall portion defining the recess has a flat portion and a curved portion, and the protruding portion may be disposed on the curved portion. Further, the conductive member may be a plated layer. In addition, the base body may be formed of a thermosetting resin.

In addition, a depression may be provided in the bottom portion of the base body of the light emitting device. The base body defining the recess may be provided with a depression in its upper surface of the bottom portion. That is, the bottom surface defining the recess may not be formed in a flat shape but in a shape having a partial depression. Accordingly, the bottom surface is not flat but provided with an uneven shape, thereby the adhesion between the sealing member and the bottom surface can further be increased.

Another light emitting device includes a base body forming a recess defined by a bottom surface and a side wall thereof, a conductive member whose upper surface being exposed in the recess and whose lower surface forming an outer surface, a light emitting element mounted in the recess and electrically connected to the conductive member, and a sealing member disposed in the recess to cover the light emitting element, the base body is made of a resin with its bottom portion and side wall portion formed integrally, and a depression may be provided in the bottom surface of the recess. Accordingly, the bottom surface is not flat but provided with an uneven shape, thereby the adhesion between the sealing member and the bottom surface can further be increased.

Another light emitting device includes a base body forming a recess defined by a bottom surface and a side wall thereof, a conductive member whose upper surface being exposed in the recess and whose lower surface forming an outer surface, a light emitting element mounted in the recess and electrically connected to the conductive member, and a sealing member disposed in the recess to cover the light emitting element. The base body has a bottom portion and a side wall portion integrally formed of a resin, the inner surface of the side wall portion has a protruding portion at a position closer to the bottom surface than to the upper surface. With this arrangement, a thin and small-sized light emitting device excellent in light extraction efficiency and reliability can be obtained. Also, the inner surface of the side wall portion defining the recess has a flat portion and a curved portion, and the protruding portion may be disposed on the curved portion. It is preferable that the protruding portions are disposed in a plural number in the recess in a height direction or in a horizontal direction. Further, the conductive member may be a plated layer. In addition, the base body is formed of a thermosetting resin.

A resin package of the present invention includes a base body forming a recess defined by a bottom surface and a side wall thereof, a conductive member exposed in the bottom surface of the recess and whose lower surface formed an outer surface, and a protruding portion disposed in the recess. The base body has a bottom portion and a side wall portion integrally formed of a resin, the inner surface of the side wall of the recess has a curved surface portion. The protruding portion is disposed in close vicinity to the curved surface portion. With this arrangement, fixing strength with a member which can be disposed in the recess can be enhanced.

Another resin package includes a base body forming a recess defined by a bottom surface and a side wall thereof, a conductive member exposed in the bottom surface of the recess and whose lower surface formed an outer surface, and a sealing member disposed in the recess. The base body has a bottom portion and a side wall portion integrally formed of a resin, and a depression is provided in the bottom surface of the recess.

Further, a method of manufacturing the light emitting device can include a step of preparing a conductive member, a step of arranging a mold release sheet on an inner surface of a mold having an upper mold and a lower mold, so that the mold release sheet is stretched to conform to a bulging portion in the mold, and arranging a conductive member interposed between the upper mold and the lower mold of the mold, a step of injecting a resin in the mold and with the fluid resistance of the resin, stretching the mold release sheet to exceed its stretching limit to form an opening in the mold release sheet at a position on a side surface of the mold corresponding to an inner surface of a recess of a base body of after being molded, and also forming a protruding portion on an inner surface of a recess in a molded base body, a step of bonding a light emitting element in a bottom surface of the recess, and a step of filling a sealing resin in the recess.

In another method of manufacturing the light emitting device, a conductive member can be formed on a surface of a support substrate by way of plating.

Further, a method of manufacturing the resin package includes a step of preparing a conductive member, a step of arranging a mold release sheet on an inner surface of a mold having an upper mold and a lower mold, so that the mold release sheet is stretched to conform to a bulging portion of the mold, and arranging a conductive member interposed between the upper mold and the lower mold of the mold, a step of injecting a resin in the mold and with the fluid resistance of the resin, stretching the mold release sheet to exceed its stretching limit to form an opening in the mold release sheet at a position on a side surface of the bulging portion of the mold corresponding to an inner surface defining a recess in a base body of after being molded, and also forming a protruding portion on an inner surface defining a recess in a molded base body.

In another method of manufacturing the resin package, a conductive member can be formed on a surface of a support substrate by way of plating.

Effect of the Invention

The light emitting device according to the present invention is capable of preventing the light from the light emitting element from leaking out from the bottom side, so that the light emitting device with improved light extracting efficiency in its upper side direction can be obtained with a good manufacturing yield.

MODE(S) FOR CARRYING OUT THE INVENTION

The following description will describe embodiments according to the present invention with reference to the drawings. The preferred embodiments are described herein to exemplify the light emitting device and the method of manufacturing the light emitting device, and the present invention is not limited to the embodiments. Furthermore, it should be appreciated that the members shown in claims attached hereto are not specifically limited to members in the embodiments. Unless otherwise specified, any dimensions, materials, shapes and relative arrangements of the members described in the embodiments are given as an example and not as a limitation. Additionally, the sizes and the arrangement relationships of the members in each of drawings are occasionally shown larger exaggeratingly for ease of explanation. Members same as or similar to those of this invention are attached with the same designation and the same reference numerals, and their description is omitted.

Example 1

Figure 1A:
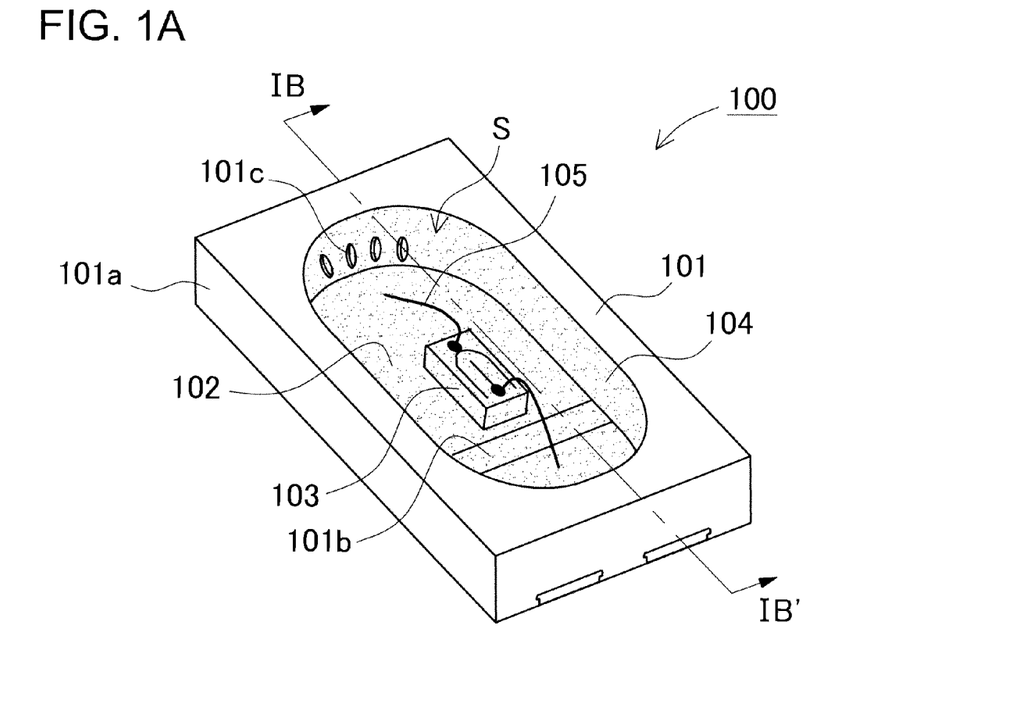
FIG. 1A is a perspective view showing a light emitting device according to Embodiment 1 of the present invention.
Figure 1B:
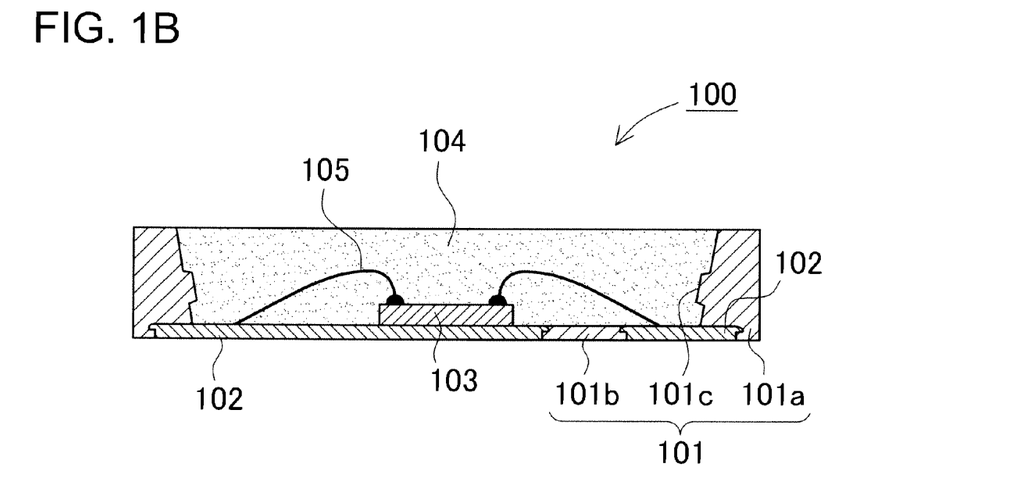
FIG. 1B is a cross sectional view of the light emitting device of FIG. 1A taken along the line IB-IB'.

A light emitting device 100 of Example 1 is shown in FIG. 1A and FIG. 1B. FIG. 1A is a perspective view showing the light emitting device 100 and FIG. 1B is a cross-sectional view showing the light emitting device 100 shown in FIG. 1A taken along the line IB-IB'.

In Example 1, the light emitting device 100 includes, as shown in FIG. 1A and FIG. 1B, a base body 101 provided with a recess S defined by a bottom surface and a side surface, and a pair of conductive members 102 whose upper surfaces are exposed at the bottom surface of the recess S. The conductive members 102 are disposed so that its lower surface provides an outer surface of the light emitting device 100, and thus together with the base body 101, constitute a part of the lower surface of the light emitting device 100. In the recess S, a light emitting element 102 is mounted by using a bonding member (not shown) and is electrically connected to the respective conductive members 102 by a conductive wire 105 or the like. Further, an optically transmissive sealing member 104 is disposed in the recess S to cover the light emitting element 103 or the like.

Further, the base body 101 has the bottom portion 101b and the side wall portion 101a integrally formed of a resin, and a protruding portion 101c is formed on the inner surface of the side wall portion 101a at a position closer to the bottom surface than to the upper surface.

(Base Body)

In the present embodiment, the base body 101 is made of a resin, with an addition of a filler selected from various kinds light-blocking fillers, capable of blocking light from the light emitting element 103, and is disposed to hold the conductive members 102 which serves as a pair of the positive and negative electrodes.

A bottom portion 101b is provided in the base body 101 for electrical insulation between the conductive members, so that light can be prevented from leaking out from the lower surface side of the light emitting device 100, and thus the light extracting efficiency of the light in the upper surface direction can be improved. Further, the side wall portion 101a is provided in the base body 101 so that the recess S is formed to enable to prevent the emission of light in the side surface side of the light emitting device 100, which allows efficient emission of light in the upper surface direction. The bottom portion 101b and the side wall portion 101a of such a base body are integrally formed with the same resin, so that the light can be prevented from leaking because of the absence of a joining portion, and that enables efficient forming with a single manufacturing step.

The height (depth) of the recess S from the bottom surface to the upper surface is preferably 0.5 mm or less, more preferably 0.4 mm or less, further preferably 0.35 mm or less. In the case of such recess of relatively small in depth, an area of contact with a sealing member filled in the recess is small, which likely causes reduction of adhesion. Thus, providing a protruding portion on the inner surface of the side wall portion as in the present invention, adhesion between the base body and the sealing member can be improved.

In the case where the surfaces of the conductive members are made of Ag, they are likely deteriorate (sulfrated) by a sulfur containing gas. Therefore, it is preferable to use a hard material for the sealing member. However, such a material tends to detach at the interface with the inner surface of the side wall portion due to the thermal stress applied at the time of reflow mounting. However, with the protruding portion as in the present invention, occurrence of the detachment can be decreased. Particularly, in the case where the depth of the recess is small, the distance from the surface of the sealing member to the conductive members becomes small, so that by using the protruding portion as in the present invention, occurrence of detachment can be reduced even if the sealing member is of relatively hard type.

An appropriate shape can be employed for the outer shape of the base body, examples of the shape include a rectangular shape in top view as shown in FIG. 1A, as well as a square shape, a polygonal shape, a circular shape, and a shape which is a combination of these shapes. An appropriate shape can also be employed for the shape of the opening of the recess, such as a square shape, a rectangular shape, a circular shape, an ellipsoidal shape, a track shape, a polygonal shape, or a shape which is a combination of these shapes. A track shape is preferable, in which case, a rectangular shape of the base body in top view preferably include a linear portion at an approximately central portion in the longitudinal direction and a curved portion in the lateral direction.

It is preferable that the inner surface of the side wall of the recess is perpendicular with respect to the bottom surface, or as shown in FIG. 1B, is angled so that the recess is wider at the upper surface side than that at the bottom surface side. In the case where the base body is formed by using a mold with a mold release sheet, a mold release sheet having elastic properties may be used so that the corners between the bottom surface and the inner surface of the recess have a rounded shape. In this case, the side wall is formed so that the inner surface of the side wall extends continuously on the conductive members toward the center portion of the bottom of the recess with its thickness gradually decreasing. With the rounded corners, the sealing member can be disposed in the recess without containing air, and the stress generated at the time of hardening can be dispersed, so that the sealing member can be restrained from detaching from the base body.

According to the present invention, protruding portions 101c are formed on the inner surface of the side wall portion 101a, and the protruding portions 101c are also integrally formed with the bottom portion 101b and the side wall portion 101a. The protruding portions 101c are, as shown in FIG. 1A and FIG. 1B, formed on the inner surface of the side wall portion at the positions closer to the bottom surface than to the upper surface. Preferably, the protruding portions are disposed to extend in the height direction of the inner surface from near the center toward the bottom surface, either reaching the bottom surface in the recess or, as shown in the figures, being spaced apart from the bottom surface.

The protruding portions can be disposed at any locations in the inner periphery of the recess, but as shown in FIG. 1A, but in the case where the recess is such that the upper surface defines the opening of the recess in a racetrack shape in top view, which has a linear portion and a curves portion, and the inner surface correspondingly includes a flat portion and a curved surface, the protruding portions are preferably disposed on a curved portion of the inner surface of the recess. The protruding portion is preferably disposed at a portion where the angle of the inner surface changes, for example, a curved surface having a radius of curvature different from other portions, a corner, or a portion close to them. As described above, disposing the protruding portion in close vicinity to a curved surface integrally with the recess, the mechanical strength of the base body can be enhanced. Particularly, disposing a plurality of protruding portions near a curved surface allows increasing the strength at the curved surface where stress concentrates, so that the reliability can be enhanced. For example, in FIG. 1A, four protruding portions 101c are disposed on one curved portion of the inner surface. This portion is likely to be subjected to the stress generated by the shrinkage at the time of hardening of the sealing member 104. Therefore, the portion can be easily detached by the thermal stress caused by cure shrinkage, reflow or the like. Detachment between the sealing member 104 and the base body 101 causes the conductive wires 105 connected to the respective conductive members 102 to be easily subjected to the stress. This may cause a problem such as disconnection of the conductive wire or the like, but disposing the protruding portions 101c enables to reduce the influence caused by the detachment, so that occurrence of detachment of the wire can be reduced. As described above, the inner surface of the side wall portion defining the recess has a portion where the angle of tilt changes. Therefore, disposing the protruding portion at the portion where the angle of tilt of the inner surface changes, adverse effects on such position exerted by the detachment can be reduced. Also as shown in FIG. 1B, disposing the protruding portion 101c on the inner surface of the base body 101 defining the recess S enables to improve the attachment at the interface between the sealing member 104 filled in the recess and the base body 101, so that adhesion can be improved. Particularly, providing a protruding portion having a convex shape protruding toward the center of the recess enables to provide an anchor effect. Moreover, disposing the protruding portion on the inner surface defining the recess in which a light emitting element to be disposed, light from the light emitting element can be diffusely reflected, so that improvement in the light extraction efficiency to outside can also be expected.

In FIG. 1A, four protruding portions are disposed on one curved portion, but the present invention is not limited to this, one or a plurality of the protruding portions may be disposed. The plurality of protruding portions can be disposed in the recess not only in a single direction of height direction or lateral direction, but also disposed plurally in a two-dimensional arrangement. Also, it is not necessary to dispose the protruding portions of the same shape and the same number on the both curved portions, the protruding portions may be disposed on each of the curved portions with different shapes and/or with different numbers. Further, a protruding portion may be disposed on the flat portion.

n the present embodiment, a plurality of the protruding portions 101c having an elliptical shape are disposed spaced apart from each other, but the shape may be a circular shape, a quadrangular shape, a polygonal shape, or a shape which is a combination of these shapes, or further, an irregular shape or a shape in which one or more of these shapes are partially connected. In particular, a protruding portion of a shape having a part whose width is wider at the side closer to the bottom surface than at the side closer to the upper surface of the recess, or of a shape disposed at a position spaced away from the bottom surface of the recess can only be realized by using an elastic mold release sheet and is preferable.

The base body 101 may be made of any materials as long as the materials are capable of blocking light from the light emitting element 103. Though, a material having a small difference in linear expansion coefficient with respect to the support substrate is preferable. Further, an insulating member is preferably used. Examples of the preferable materials include resin such as a thermosetting resin and a thermoplastic resin. Particularly, in the case where the thickness of the conductive members is about 25 µm to 500 µm, particularly in the case where the thickness is very small, about 25 µm to 200 µm, a thermosetting resin is preferably used, and thereby, a base body of a very thin type can be obtained. Specific examples include, (a) an epoxy resin composition, (b) a silicone resin composition, (c) a modified epoxy resin composition such as a silicone-modified epoxy resin, (d) a modified silicone resin composition such as an epoxy-modified silicone resin composition, (e) a polyimide resin composition, and (f) a modified polyimide resin composition.

Particularly, a thermosetting resin, such as that described in JP 2006-156704A is preferable. Among the thermosetting resin, for example, an epoxy resin, a modified epoxy resin, a silicone resin, a modified silicone resin, an acrylate resin, a urethane resin and the like are preferably used. More specifically, it is preferable to use a solid epoxy resin composition that contains a colorless and transparent mixture prepared by mixing and dissolving the equivalent quantities of (i) an epoxy resin composed of triglycidyl isocyanurate and hydrogenated bisphenol A triglycidyl ether and (ii) an acid anhydride composed of hexahydrophthalic anhydride, 3-methyl-hexahydrophthalic anhydride and 4-methyl-hexahydrophthalic anhydride. It is further preferable to use a B-stage solid epoxy resin composition obtained by adding 0.5 parts by weight of DBU (1,8-diazabicyclo(5,4,0)undecene-7) as a curing accelerator, 1 part by weight of ethylene glycol as a co-catalyst, 10 parts by weight of a titanium oxide pigment, and 50 parts by weight of a glass fiber to 100 parts by weight of the mixture described above, and applying heat to partially cure it.

It is also preferable to use a thermosetting epoxy resin composition whose essential component is an epoxy resin containing a triazine derivative epoxy resin described in WO 2007/015426. For example, a 1,3,5-triazine derivative epoxy resin is preferably contained. In particular, an epoxy resin having an isocyanurate ring has excellent light resistance and electrical insulation. It is desirable to have a divalent, more preferably trivalent epoxy group per isocyanurate ring. Specifically, tris(2,3-epoxypropyl) isocyanurate, tris(α-methylglycidyl) isocyanurate or the like may be used. The triazine derived epoxy resin preferably has a softening point of 90 to 125° C. The triazine derived epoxy resin may also be used with a hydrogenated epoxy resin or other epoxy resins. Further, in the case where a silicone resin composition is used, a silicone resin that contains a methyl-silicone resin is preferably used.

A case employing a triazine derived epoxy resin will be described below specifically. It is preferable that an acid anhydride which serves as a curing agent is used with a triazine derived epoxy resin. Particularly, an acid anhydride which is a non aromatic, and does not include a carbon-carbon double bond, is used to improve light resistance. Specific examples thereof include hexahydrophthalic anhydride, methylhexahydrophthalic anhydride, trialkyltertahydrophthalic anhydride, hydrogenated methylnadic anhydride, and the like. In particular, methylhexahydrophthalic anhydride is preferable. It is also preferable to use an antioxidant, and for example, a phenol-based or a sulfur-based antioxidant may be used. A known curing catalyst for epoxy resin compositions can be used as a curing agent.

Further, a filler for rendering a light blocking property or various additives where appropriate can be mixed in such a resin. In the present specification, the term "light blocking resin constituting the base body 106 includes those described above. The light transmittance can be adjusted by mixing fine particles or the like of $TiO_2$, $SiO_2$, $Al_2O_3$, MgO, $MgCO_3$, $CaCO_3$, $Mg(OH)_2$, $Ca(OH)_2$, and the like, as a filler. It is preferable to block about 60% or more, more preferably about 90% or more of the light from the light emitting element. The base body 106 is capable of either reflecting or absorbing light. In the case where the light emitting device is used in a lighting application or the like, light is preferably blocked by reflection. In that case, the reflectivity with respect to the light from the light emitting element is preferably 60% or more, more preferably 90% or more.

The various kinds of fillers as described above can be used singly or in combination of two or more. For example, a filler for adjusting the reflectivity and a filler for adjusting the linear expansion coefficient which will be described later can be used together.

For example, in the case where $TiO_2$ is used as a white filler, it is preferably added at 10 to 30 wt %, more preferably at 15 to 25 wt %. $TiO_2$ of either rutile type or anatase type may be used. In view of light-blocking property and light-resistance property, the rutile type is preferable. Further, in the case where an improvement in dispersibility and light resistance are intended, a filler modified by surface treatment can also be used. Oxide hydrate or oxide such as alumina, silica, zinc oxide may be used in such surface treatment of a filler made of $TiO_2$. In addition to those described above, $SiO_2$ is preferably added in a range of 60 to 80 wt %, more preferably of 65 to 75 wt % as a filler for mainly adjusting the linear expansion coefficient. For the $SiO_2$ described above, the amorphous silica that has smaller linear expansion coefficient that that of the crystalline silica is preferably employed. The filler preferably has a particle size of 100 μm or less, more preferably 60 μm or less. Further, particle shape of the filler is preferably spherical which can improve the filling efficiency at the time of molding the base body. In order to improve image contrast in the application such as display, the filler preferably has light absorption of 60% or more, more preferably 90% or more, with respect to the light emitted from the light emitting element. In this case, a filler such as (a) a carbon such as acetylene black, activated carbon and graphite, (b) an oxide of transition metal such as iron oxide, manganese dioxide, cobalt oxide or molybdenum oxide, or (c) an organic pigment can be used according to application purpose.

The linear expansion coefficient of the base body is preferably adjusted in a range of $5 \times 10^{-6}$/K to $35 \times 10^{-6}$/K, and more preferably in a range of $7 \times 10^{-6}$/K to $20 \times 10^{-6}$/K. With this, generation of warpage can be easier to suppress during cooling step after forming the base bodies, so that good yield in manufacturing can be obtained. In the present specification, the term "linear expansion coefficient" refers to the linear expansion coefficient of the base body, that is formed from the light-blocking resin prepared with addition of various fillers, at a temperature below the glass transition temperature thereof.

From another point of view, the base body is preferably adjusted to have a small difference in linear expansion coefficient with respect to the conductive member. The difference with respect to the conductive member is preferably 50% or less, more preferably 40% or less, and further preferably 20% or less. Accordingly, the conductive members and the base body can be prevented from detaching in the individually separated light emitting devices. Thus, light emitting devices having high reliability can be obtained. It is needless to say that in the present specification, the term "resin package" includes not only in a state of after cutting the lead frame but also a state of before cutting.

In the case where a plated material (electroformed material) is used for the conductive member, the conductive member is preferably adjusted to have a small difference in linear expansion coefficient with respect to the support substrate which to be removed before individually separating the devices. The difference is preferably 30% or less, more preferably 10% or less. In the case where a SUS plate is used for the support substrate, the difference in linear expansion coefficient is preferably 20 ppm or less, more preferably 10 ppm or less. In this case, the content of the filler is preferably 70 wt % or more, more preferably 85% or more. With this arrangement, the residual stress in the support substrate and the base body can be controlled (relaxed), so that warpage can be reduced in the aggregate of the optical semiconductors before cut out individually. Reducing the warpage will in turn reduce damage such as disconnection of conductive wire inflicted to the inside of the devices and can suppress positional error at the time of individually separating the devices, so that good yield in manufacturing can be obtained. For example, the linear expansion coefficient of the base body is preferably adjusted in a range of $5 \times 10^{-6}$/K to $25 \times 10^{-6}$/K, and more preferably in a range of $7 \times 10^{-6}$/K to $15 \times 10^{-6}$/K. With this, generation of warpage can be easier to suppress during cooling step after forming the base bodies, so that good yield in manufacturing can be obtained. In the present specification, the term "linear expansion coefficient" refers to the linear expansion coefficient at a temperature below the glass transition temperature of the base body formed from a light-blocking resin which is prepared with using various fillers. In this temperature range, the linear expansion coefficient of the base body is preferably close to the linear expansion coefficient of the support substrate.

From a different point of view, in the case where a plated material (electroformed material) is used for the conductive member, the base body is preferably adjusted to have a small difference in linear expansion coefficient with respect to the conductive member. The difference is preferably 50% or less, more preferably 40% or less, and further preferably 20% or less. Accordingly, in the individually separated light emitting devices, the conductive member and the base body can be prevented from detaching, and thus, light emitting devices having high reliability can be obtained.

(Conductive Member)

A conductive member is to serve as a pair of electrode to supply electricity to the light emitting element. In the present embodiment, the conductive member is electrically connected with the light emitting element by using a conductive wire or a bump, and serves as a pair of electrodes to supply electricity from outside. The light emitting element may be mounted on a conductive member either directly or indirectly through another member such as a submount. In addition, there may be employed a conductive member which does not contribute to conduction of electricity but is merely used to mount the light emitting element.

In the present embodiment, the conductive member is disposed to form an outer surface of the lower surface of the light emitting device, that is, to be exposed outside (at the lower surface) without covered by the sealing member or the like. The shape, the size, and the like of the conductive member can be appropriately selected according to the size of the light emitting device and the number and the size of the light emitting elements to be mounted.

The upper surface of the conductive member is preferably a flat plane, but may have microscopic irregularity, grooves, holes or the like. In the same manner, the lower surface of the conductive member is also preferably a flat surface, but may also have microscopic irregularity.

The side surfaces of the conductive member may be flat surfaces. In view of the adhesion or the like with the base body, a side surface of the conductive member preferably has a protrusion protruding in the base body 101 as shown in FIG. 1B. It is preferable that the protrusion is disposed at a position spaced apart from the lower surface of the conductive member 102, and with this, problems such as detachment of the conductive member from the base body 101 are not likely to occur. Instead of providing the protrusion, the side surface of the conductive member may be angled so that the lower surface of the conductive member is narrower than the upper surface, and with this, the conductive member can be prevented from detaching.

Such a protrusion can be disposed at an appropriate position in the peripheral portion of the conductive member disposed the position is different from the outer surface of the light emitting device 100. For example, the protrusion can be disposed locally, only at each of two opposite side surfaces of the conductive member having a rectangular shape in top view. In order to further reliably prevent the detachment, the protrusions are preferably formed to the portion surrounding an entire circumference of the conductive member, except for the surface to be the outer surface.

The thickness of the conductive member is preferably from 25 μm to 500 μm, more preferably from 25 μm to 200 μm, and further preferably 50 μm to 100 μm. In the case where the conductive member has a thickness of 100 μm or greater, a rolled metal plate may be used or plating may be performed. Further, a side of the conductive member in the thickness direction can be used as a mounting surface, which enables obtaining a side-view type light emitting device capable of emitting light in a direction perpendicular to the mounting surface. The conductive member having a very small thickness such as of 100 μm or less is preferably a plated layer formed by using a plating method, and is particularly preferably a stack of plated layers.

The same material is preferably used for each of the conductive members, and thus the number of manufacturing steps can be reduced, though different materials may also be used. But different materials can be used. Examples of such material include metals such as copper, aluminum, gold, silver, tungsten, molybdenum, iron, nickel, cobalt and an alloy thereof (such as an iron-nickel alloy), phosphor bronze, iron-containing copper, eutectic solder materials such as Au—Sn, solders such as SnAgCu and SnAgCuIn, and ITO. A particularly preferable material among the solder materials has a composition adjusted so that once the solder particles are melted and solidified, an alloy between a metal that is to be bonded and the solder is formed and the melting point rises, and so that remelting does not occur in an additional thermal treatment such as reflow mounting.

These can be used alone or in the form of an alloy. Further, these can be provided as a plurality of layers, by stacking layers (plating) or the like. For example, in the case where a light emitting element is used as the semiconductor element, a material capable of reflecting light from the light emitting element is preferably used for the outermost surface of the conductive member. Preferable examples thereof include gold, silver, copper, Pt, Pd, Al, W, Mo, Ru, Rh. Further, the conductive member at the outermost surface preferably has a high reflectivity and a high glossiness. Specifically, the reflectivity in visible range is preferably 70% or more, and in such case, Ag, Ru, Rh, Pt, Pd, etc. are preferably used. It is also preferable that the conductive member has a high-gloss surface. The gloss value is preferably 0.3 or greater, more preferably 0.5 or greater, and further preferably 1.0 or greater. The gloss value shown in the specification is a value measured using a micro surface color difference meter VSR 300A manufactured by NIPPON DENSHOKU INDUSTRIES CO., LTD., under a condition of illumination angle of 45°, measuring area of 0.2 mmΦ, and vertical light receiving. It is preferable that the support substrate side of the conductive member is made of Au, Sn, a Sn-alloy, an eutectic solder such as AuSn, or the like, which are advantageous for mounting to a circuit board and the like.

Moreover, an intermediate layer may be formed between the uppermost surface (top layer) of the conductive member and the support substrate side (bottom layer). In order to improve the mechanical strength of the conductive member and the light emitting device, a metal having high corrosion resistance, for example Ni, is preferably used for the intermediate layer. In order to improve heat dissipation, copper, which has high thermal conductivity, is preferably used for the intermediate layer. As described above, an appropriate member is preferably used for the intermediate layer, according to the purpose and application. Pt, Pd, Al, W, Ru, Pd etc., can also be used for the intermediate layer as well as the metals described above. A metal having good adhesion with the metal in the top layer and the bottom layer may be formed in a stacked layer as the intermediate layer. The intermediate layer preferably has a thickness larger than that of the top layer or the bottom layer. In particular, the thickness is preferably in a range of 80% to 99% of the total thickness of the conductive member, and is further preferably in a range of 90% to 99%.

In the case where the plated layer is made of metal elements, the linear expansion coefficient depends on the composition thereof. Therefore, the bottom layer and the intermediate layer preferably have a linear expansion coefficient relatively close to that of the support substrate. For example, in the case where SUS430 having a linear expansion coefficient of $10.4 \times 10^{-6}$/K is used for the support substrate, the conductive member to be disposed thereon may be formed with a stacked layer structure containing a metal (as a main component) as described next. A stacked layer structure is preferable, such as, from the bottom layer side, Au having a linear expansion coefficient of $14.2 \times 10^{-6}$/K (0.04 to 0.1 μm), a first intermediate layer of Ni having a linear expansion coefficient of $12.8 \times 10^{-6}$/K (or Cu having a linear expansion coefficient of $16.8 \times 10^{-6}$/K) (25 to 100 μm), a second intermediate layer of Au (0.01 to 0.07 μm), and the top layer of Ag having a linear expansion coefficient of $119.7 \times 10^{-6}$/K (2 to 6 μm). The Ag of the top layer has a linear expansion coefficient largely different from that of the metals of other layers, but Ag is used because the reflectivity of the light from the light emitting element is set as the priority. The thickness of Ag of the top layer is set to be very small, so that it has a very small effect on the warpage and thus poses little practical problems.

(Sealing Member)

The sealing member is provided to protect the electronic components such as a light emitting element, a light receiving element, a protective element, and a conductive wire from dust, moisture, external force or the like, and disposed in the recess of the base body. A protruding portion is disposed on the inner surface of the side wall of the recess, so that the sealing member can be prevented from easily detaching from the base body. Particularly, in the case where Ag, which has high reflectivity, is disposed on the surface of the conductive member (the surface exposed at the bottom surface in the recess), the reflectivity decreases which in turn decreases the light extraction efficiency, due to discoloration (staining) caused by intrusion of gas (particularly a gas containing sulfur component) which is caused by detachment between the sealing member and the base body. However, by providing the protruding portion as in the present invention, the occurrence of detachment between the sealing member and the base body can be reduced, and discoloration of Ag can be prevented.

The sealing member is preferably formed from a material having optical transmissivity which allows the light from the light emitting element to transmit therethrough, and having light resistance against deterioration by such light. Further, it is preferable that the material allows little permeation of water vapor and a gas containing sulfur component etc., and for example, has water vapor permeability of about 50 (g/mm$^2$·Day) or less (at the thickness of the sealing member of 0.8 mm) Moreover, it is preferable that the material has a hardness after curing of 30 Shore D or more, where a higher hardness is preferable, but in view of adhesion with the base body, a Shore D hardness of 35 to 50 is more preferable. Under the stress generated by shrinkage during its curing or thermal change during operation, the sealing member having such hardness may easily detach from the base body, but providing the protruding portion on the inner surface of the recess enables to reduce occurrence of such detachment.

Examples of the material thereof include an insulating resin composition having optical transmissivity which allows the light from the light emitting element to transmit therethrough, such as a silicone resin composition, a modified silicone resin composition, an epoxy resin composition, a modified epoxy resin composition, and an acrylic resin composition. Also, a silicone resin, an epoxy resin, a urea resin, a fluororesin and a hybrid resin containing at least one of these resins can be used. The material is not limited to those organic materials described above, and an inorganic material such as glass or silica sol can also be used. In addition to these materials, a coloring agent, a light diffusing agent, a light reflecting material, various fillers, a wavelength converting material (a fluorescent material) or the like can also be contained as required. The amount of the sealing member is to be sufficient to cover the electric components described above.

The shape of the outer surface of the sealing member can be selected variously according to the light distribution characteristics etc. For example, the light distribution characteristics can be adjusted by forming the upper surface in a shape such as a convex lens, a concave lens, or Fresnel lens. A lens etc. made of a different material may be provided additionally on the sealing member. In the case where a molded body containing a fluorescent material (for example a sheet-shape molded body containing a fluorescent material or a dome-shape molded body containing a fluorescent material) is used, the sealing member is preferably formed from a material having excellent adhesion with the molded body containing a fluorescent material. The molded body containing fluorescent material can be formed by using an inorganic material such as glass, as well as by using a resin composition.

(Bonding Member)

The bonding member (not shown) is a member for mounting and connecting a light emitting element, a light receiving element, a protective element or the like, on the conductive member and/or the bottom portion of the base body. A conductive bonding member or an insulating conductive member can be selected according to the substrate on which an element to be mounted. For example, in the case where the semiconductor light emitting element has a nitride semiconductor layers stacked on a sapphire substrate which is an insulating substrate, the bonding member may either be of insulating or conductive. In the case where a conductive substrate such as a SiC substrate is used, electric conductivity can be established by using a conductive bonding member. The insulating bonding member can be formed using an epoxy resin composite, a silicone resin composite, a polyimide resin composite, a modified resin or a hybrid resin of those, or the like. In the case where those resins are used, in view of deterioration caused by light and/or heat generated from the semiconductor light emitting element, a metal layer with high reflectivity such as Al coating or Ag coating or a dielectric reflective coating can be provided on the back surface of the light emitting element. In this case, a method such as vapor deposition, sputtering, bonding of thin coating, or the like, can be used. The conductive bonding member may be formed using a conductive paste of silver, gold, palladium, a eutectic solder material such as Au—Sn, a brazing material such as a low melting temperature metal, or the like. Further, in the case where among those bonding members, in particular, an optically transmissive bonding member is used, a fluorescent member capable of absorbing the light from the semiconductor light emitting element and emitting light of different wavelength can be contained in the bonding member.

(Conductive Wire)

The conductive wires used for electrically connecting the light emitting element and the respective conductive members may be formed of a metal such as gold, copper, platinum, aluminum and an alloy thereof. It is particularly preferable to use gold that has excellent thermal resistance etc.

(Wavelength Converting Member)

The sealing member may include a fluorescent member as the wavelength converting member that absorbs at least a part of light emitted from the light emitting element and emits light of different wavelength.

A fluorescent member capable of converting light from a light emitting element into light of a longer wavelength gives a higher efficiency. However, the fluorescent member is not limited to those above, and various fluorescent members such as one capable of converting light emitted from a light emitting element into light of a shorter wavelength, or one capable of converting light that has been converted by other fluorescent member, may also be used. Such a wavelength converting member may be formed of a single layer of one kind of fluorescent member, a single layer of a mixture of two or more kinds of fluorescent members, a stacked layer of two or more single layers containing one kind of fluorescent member, or a stacked layer of two or more single layers each containing a mixture of two or more kinds of fluorescent members.

In the case where a semiconductor light element having a nitride-based semiconductor as its light emitting layer is used as the light emitting element, a fluorescent member capable of absorbing light from the light emitting element and emitting light of different wavelength can be used. For example, a nitride-based fluorescent material or oxynitride-based fluorescent material, activated mainly with a lanthanoid element such as Eu, Ce can be used. More specifically, it is preferable to use at least one selected from the following: (a) α- or β-sialon-based fluorescent materials, various alkaline-earth metal nitride silicate fluorescent materials, and various alkaline earth-metal aluminum nitride silicate fluorescent materials, which are activated with Eu (for example, CaSiAlN$_3$: Eu, SrAlSi$_4$N$_7$:Eu); (b) alkaline-earth metal halogen apatites, alkaline-earth metal halosilicates, alkaline-earth metal silicates, alkaline-earth metal haloborates, alkaline-earth metal aluminates, alkaline-earth metal sulfides, alkaline-earth metal thiogallates, and alkaline-earth metal silicon nitrides or germanates, which are activated mainly with a lanthanoid element such as Eu or a transition metal element such as Mn; (c) rare-earth aluminates, rare-earth silicates and alkaline-earth metal rare-earth silicates, which are activated mainly with a lanthanoid element such as Ce; and (d) organic compounds and organic complexes which are activated mainly with a lanthanoid element such as Eu. A YAG-based fluorescent material which is a rare-earth aluminate fluorescent material activated mainly with a lanthanide element such as Ce is preferable. A YAG-based fluorescent material may be represented by formulas such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$. Examples of rare-earth aluminate fluorescent materials also include $Tb_3Al_5O_{12}$:Ce and $Lu_3Al_5O_{12}$:Ce, formed by substituting a part or all of Y with Tb or Lu. Moreover, fluorescent members other than those described above, having similar properties, performance, and effects can also be used.

A member made of a molded body such as glass and resin composition and coated with a fluorescent member can also be used. Further, a molded body containing a fluorescent member can also be used. For example, glass containing a fluorescent material, YAG sintered compact, sintered body of YAG and $Al_2O_3$, $SiO_2$, $B_2O_3$, or the like, crystallized inorganic bulk of YAG precipitated in an inorganic melt etc., can be used. Also, a molded article of a fluorescent material integrally molded with an epoxy resin, silicone resin, hybrid resin, or the like, can be used.

(Light Emitting Element)

In the present embodiment, a semiconductor element of various structures, such as a structure having the positive and negative electrodes formed on the same side, a structure having the positive and negative electrodes formed on different sides, and a structure having a substrate different from the growth-substrate bonded together, can be employed as the light emitting element (semiconductor light emitting element).

The semiconductor light emitting element of any appropriate wavelength can be employed. For example, for the light emitting element capable of emitting blue or green light, ZnSe, nitride-based semiconductor ($In_XAl_YGa_{1-X-Y}N$, $0 \leq X$, $0 \leq Y$, $X+Y \leq 1$), or GaP may be employed. For the light emitting element capable of emitting red light, GaAlAs, AlInGaP, or the like may be employed. A semiconductor light emitting element made of a material other than the above may also be employed. Composition, color of emitted light, size and number of the light emitting element to be employed can be selected appropriately according to the purpose.

In the case where a light emitting device having a wavelength converting member is to obtain, it is suitable to employ a nitride semiconductor ($In_XAl_YGa_{1-X-Y}N$, $0 \leq X$, $0 \leq Y$, $X+Y \leq 1$) capable of emitting light of a short wavelength that can efficiently excite the wavelength converting member. The emission wavelength can be variously selected by the materials and the content ratio of the mixed crystal of the semiconductor layer.

A light emitting element capable of emitting ultraviolet light or infrared light can also be employed as well as a light emitting element capable of emitting visible light. Further, a light receiving element or the like can be mounted with the light emitting element or mounted separately.

(Support Substrate)

The support substrate (not shown in FIG. 1A and FIG. 1B) is a plate shape or sheet shape member formed of a metal or includes a metal, used for forming the conductive member by plating, and to be removed before the aggregate of the light emitting device are cut into individual light emitting devices in the final step, and therefore the support substrate is a member which is not included in the light emitting device. For the support substrate, an insulating plate formed of polyimide or the like provided with a conductive film formed by way of sputtering or vapor deposition can be used as well as a metal plate having electric conductivity such as a SUS plate. Alternatively, usable is an insulating planar member capable of attaching a metallic thin film or the like on it. The support substrate is needed to be removed in a final step of the manufacturing process, that is, needed to be detached from the conductive member and the base body. For this reason, a bendable member is needed to be used for the support substrate, and although it depends on the material, a planar member having a thickness of about 10 µm to 300 µm is preferably used. The support substrate is preferably formed using a metal plate of such as iron, copper, silver, kovar, nickel, a resin sheet formed of polyimide capable of attaching a metal thin film or the like on it, as well as the above-described SUS plate. Particularly, various kinds of stainless steel such as martensitic, ferritic, austenitic etc., are preferably used. Ferritic stainless steels are particularly preferable. The 400 series stainless steel and the 300 series stainless steel are particularly preferable. Further, SUS430 ($10.4 \times 10^{-6}$/K), SUS444 ($10.6 \times 10^{-6}$/K), SUS303 ($18.7 \times 10^{-6}$/K), SUS304 ($17.3 \times 10^{-6}$/K), and the like, are suitably used. In the case where acid treatment is performed as a pre-treatment of the plating, the surface of 400-series stainless steels tend to become rougher than that of 300-series stainless steels. Accordingly, the surface of a plated layer formed on the surface of an acid-treated 400-series stainless steel also tends to become rough. With this, adhesion with a sealing member and a resin constituting the base body can be improved. Whereas, the surface of 300-series stainless steels tends not to become rough. Therefore, with the use of 300-series stainless steels, the glossiness of the plated surface can be easily improved, and accordingly, the reflectivity of the light from the light emitting element can be improved, so that a light emitting device having high light extracting efficiency can be obtained.

In the case where the surface glossiness of the conductive member is to be improved, techniques such as plating, vapor deposition, or sputtering may be employed. The surface of the support substrate is preferably smooth for further improving the glossiness. For example, in the case where a SUS is used as the support substrate, 300 series SUS having relatively small grain boundary is used to obtain the outermost surface of the conductive member with high surface glossiness.

Moreover, in order to reduce potential warpage after molding, an appropriate processing may be applied on the support substrate to form a slit, a groove, or a wave shape.

(Mold Release Sheet)

The mold release sheet (film) is disposed at the portion where the molding resin to be injected, so as to facilitate easy releasing (easy removal) of the molded body from the mold, and for example, in the case where the support member is held between the upper and lower molds during molding, the mold release sheet is arranged on the lower surface of the upper mold and the upper surface of the lower mold respectively.

In order to mold a base body defining a recess, a bulging portion is needed to be formed in the mold. Thus, a mold releasing film having higher elasticity than the mold and capable of stretching to conform to the shape of the bulging portion is used. The mold release sheet is used to conform to the shape of the contour of the surface of the mold by sucking air from the suction hole provided in the mold so as to change the shape of the mold release sheet. Using such a mold release sheet having high elasticity, and further providing an opening in the mold release sheet at a corresponding position to the inner surface, a protruding portion can be formed on the inner surface of the recess of the base body. This is achieved by utilizing the high elasticity of the mold releasing film, which enables formation of the protruding portion having a shape which is difficult to form by only using rigid mold, on the inner surface of the recess.

The opening provided in the mold release sheet may be of a shape such as a circular shape, a quadrangular shape, a rectangular shape, a polygonal shape, or a shape which is a combination of these shapes, or an irregular shape. Moreover, the opening may be provided either before adhered to the mold or after adhered to the mold.

It is preferable that the materials of the mold release sheet has good removability from the mold, and further, has good removability from the base body which to be molded. Also, it is preferable to have thermal resistance at a molding temperature (130° C. to 190° C.). For example, a thermoplastic fluororesin (for example, PTFE and ETFE), polyolefin polymer (TPX), nylon or the like is preferably used, and further, for the base body, a thermosetting resin described above is preferably used.

The thickness of the mold release sheet is preferably 10 μm to 100 μm, more preferably 20 μm to 75 μm, and further preferably 30 μm to 50 μm. Furthermore, in order to stretch and conform to uneven shape provided on the mold, the mold release sheet preferably has a stretch ratio of 500 to 1000%, more preferably 600 to 900%. The protruding portion is designed such that its height from the inner surface is determined by the thickness of the mold release sheet stretched along the mold at the time of molding, and its shape is determined by the shape of the stretched mold release sheet.

The mold release sheet is formed as a single layer or a multi-layer. The mold release sheet made of a single layer has an excellent flexibility and has an advantage such that it can be thinly applied to conform to the contour of the mold. The mold release sheet made of a plurality of layers can maintain the size of the opening which is provided in the mold release sheet while maintaining its enhanced strength. In the case of employing a mold release sheet made of a plurality of layers, either the same or different materials can be appropriately selected for each layer, and for example, may be formed with the sheets having different ratio of expansion and contraction. Also, the mold release sheet can be selected in view of the stretching direction of the sheet, the direction of embossing, or the like.

(Method of Manufacturing)

The method of manufacturing the light emitting device according to Example 1 will be described below.

1. First Step

First, a support substrate formed from a metal plate and the like is prepared. A resist is applied on the surface of the support substrate as a protective film. With the thickness of the resist, the thickness of the conductive member to be formed later can be adjusted. The resist may be formed not only on the upper surface of the support substrate but also on the lower surface (surface at the opposite side). In this case, providing the resist on the substantially entire surface at the opposite side enables to prevent the formation of the conductive member on the lower surface by plating which is to be described later.

In the case where the protective film (resist) is formed by using photolithography, the protective film (resist) may either be of positive type or negative type. In this embodiment, a method using a positive type resist is described, but a positive type and a negative type can also be used in combination. Other methods can also be used, such as forming a resist by way of screen printing or attaching a sheet-shaped resist.

After drying the resist which is applied, a mask provided with openings is arranged directly or indirectly on the resist, and then ultraviolet light is applied through the mask to expose the resist. The wavelength of the ultraviolet light used in this step can be selected according to the sensitivity or the like of the resist. Thereafter, a treatment is carried out by using an etchant to form the resist including the openings. If needed, an acid activation treatment or the like can be performed at this stage.

Next, plating is carried out using a metal to form the conductive members in the openings of the resist. At this time, the plating can be carried out to obtain a larger thickness than the resist by adjusting the conditions of plating. Thus, the conductive members can be formed to the upper surface of the resist (protective film), so that the portion protruding laterally as shown in FIG. 1A can be formed. The method of plating can be selected appropriately from the known methods in the art, according to the metal to be used, or according to the desired thickness and flatness. For example, a method such as electrolytic plating or non electrolytic plating can be employed. Electrolytic plating is particularly preferably used, which facilitates removing of the resist (protective film) and formation of the conductive members with sufficiently uniform shape. Moreover, in order to improve the adhesion with the uppermost surface layer (for example, Ag), an intermediate layer (for example, Au, Ag) is preferably formed below the uppermost surface layer by way of strike plating. After plating, the protective film is washed and removed to form a plurality of conductive members spaced apart from each other.

2. Second Step

Next, a base body capable of reflecting light from the light emitting element is formed between the conductive members. All portions of the base body, the bottom portion and the side surface portion, and further the protruding portions formed on the inner surface of the side surface portion, are integrally molded in this step.

The molding can be conducted using a method such as Injection molding, transfer molding, or compression molding. For example, in the case where the base body is formed by using transfer molding, a support substrate having a plurality of conductive members disposed on it is positioned in a mold so as to be held between the upper portion and the lower portion of the mold. At this time, in the case where the upper mold is to provide the recess in the conductive member, a bulging portion is formed on the lower surface of the upper mold and the mold release sheet is attached to the entire lower surface including the bulging portion. In the case where compression mold method is used, the mold release sheet can be used in the same manner.

The mold release sheet may be previously provided with the opening, or the opening may be provided after the sheet is attached to the mold. In this case, for example, the mold release sheet is pushed against the lower surface side of the upper mold that has the bulging portion formed thereon, and further, stretched by suction or the like, to fit the bulging portion of the mold. Thereafter, the resin is injected under pressure so that the mold release sheet is further stretched by the flow resistance of the resin to exceed its elastic limit, which easily produces an opening at the side surface of the bulging portion of the mold, a position corresponding to the inner surface of the recess in the base body of after molding.

Resin pellets, a raw material of the base body, are loaded in the mold, and the support substrate and the resin pellets are heated. After the resin pellets are melted, pressure is applied to fill the melted resin in the mold and openings of the mold release sheet. The heating temperature, the heating time, the pressure and the like are appropriately adjusted according to the composition or the like of the resin. After cured, the molded body is removed from the mold and mold release sheet.

3. Third Step

Next, using a bonding member, a light emitting element is bonded on the bottom surface in the recess of the base body and is electrically connected to each conductive member using a conductive wire.

4. Fourth Step

Thereafter, a sealing member containing an optically transmissive resin is filled in the recess. Thus, the light emitting element is covered with the sealing member. The sealing member is preferably disposed to approximately the same height as the side wall of the recess, but is not limited thereto, the height may either be lower or higher than the side wall. Also, the upper surface can be either a flat surface as described above or a curved surface with its center portion depressed or protruded. The sealing member may either have a single layer structure or a multilayer structure made of two or more layers having different compositions and/or properties.

An aggregate of the light emitting devices is obtained by curing the sealing member, and then the support substrate is removed from the aggregate.

5. Fifth Step

Finally, the side wall between the recesses is cut into individual chips, thus the light emitting device provided with a single recess as shown in FIG. 1A can be obtained. Various methods can be employed for separating the individual devices, such as a dicing method using a blade and a dicing method using a laser beam.

Example 2

Figure 2A:
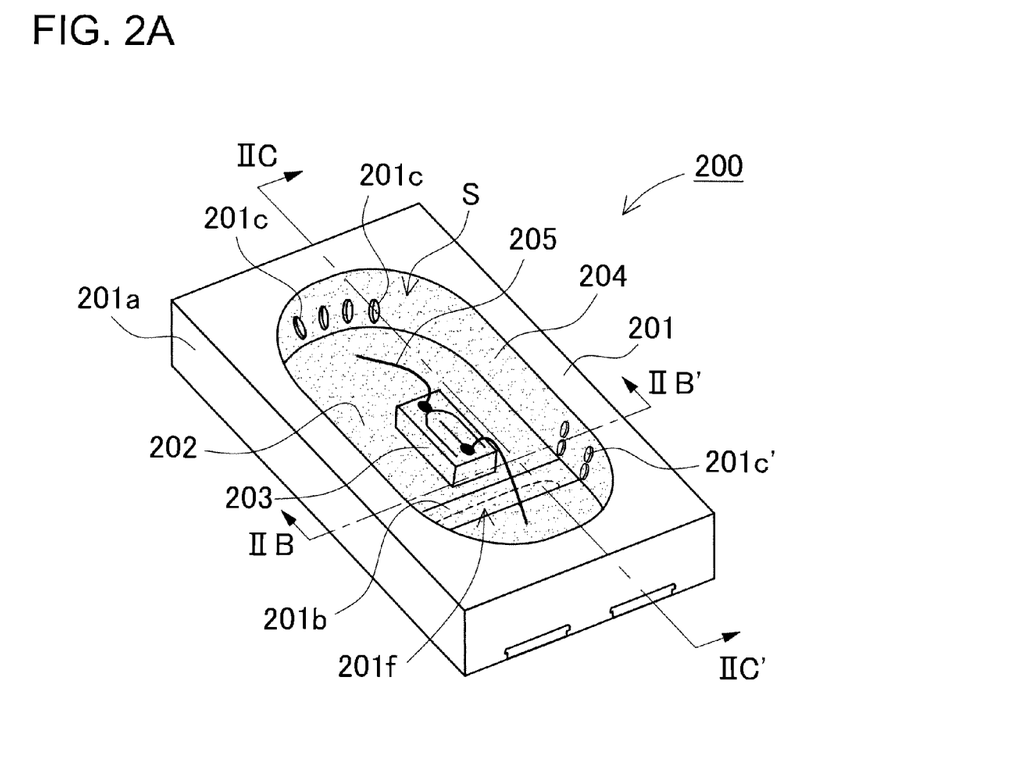
FIG. 2A is a perspective view showing a light emitting device according to Embodiment 2 of the present invention.
Figure 2B:
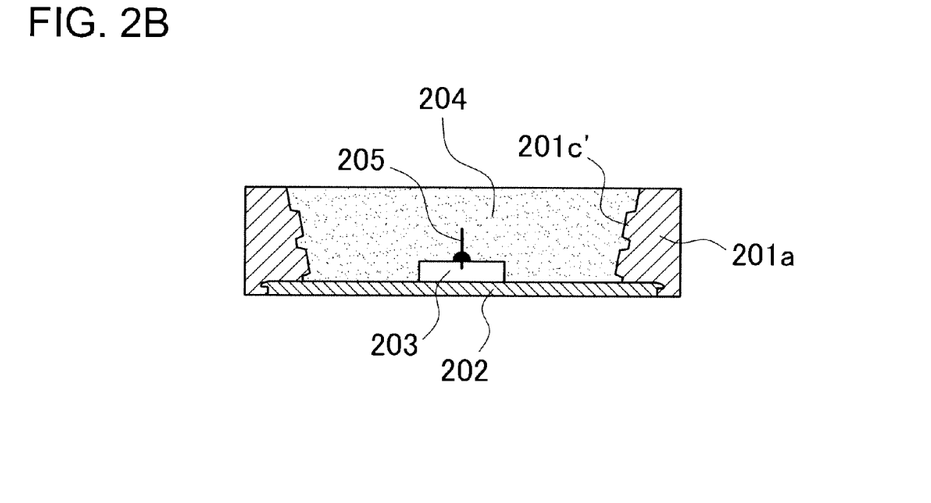
FIG. 2B is a cross sectional view of the light emitting device of FIG. 2A taken along the line IIB-IIB'.
Figure 2C:
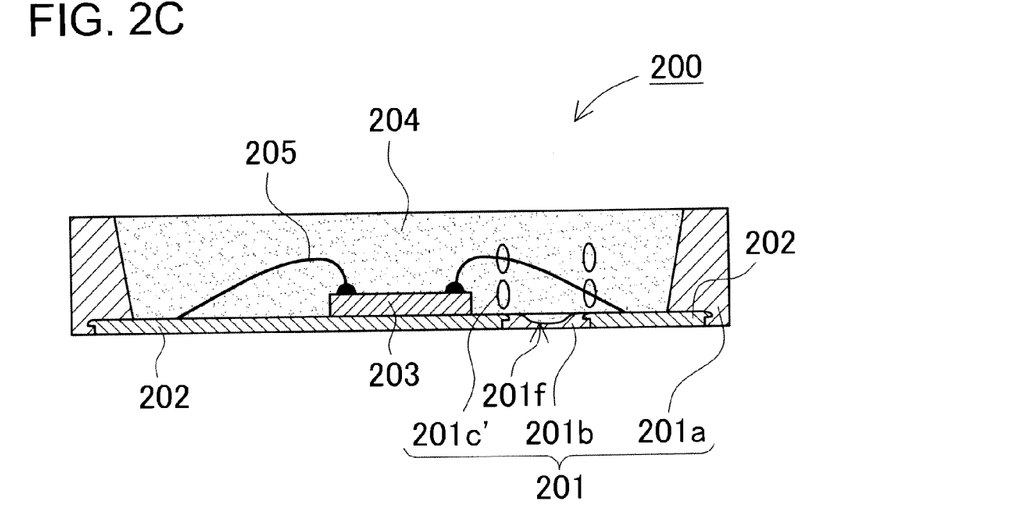
FIG. 2C is a cross sectional view of the light emitting device of FIG. 2A taken along the line IIC-IIC'.

Example 1 described above illustrated an example in which the protruding portion is disposed at the shorter side of an inner surface of the side wall. However, the protruding portion can be disposed at the longer side instead of at the shorter side or in addition to the shorter side. As Example 2, such examples will be shown in FIG. 2A to FIG. 2C. In those figures, FIG. 2A is a perspective view showing a light emitting device 200 of Example 2, FIG. 2B is a cross sectional view taken along line IIB-IIB' of FIG. 2A, and FIG. 2C is a cross-sectional view taken along line IIC-IIC' of FIG. 2A, respectively. The light emitting devices 200 shown in FIG. 2A to FIG. 2C and the light emitting device 100 shown in FIG. 1 have the reference numerals denoted to each of the members in which the last two digits correspond to the same members, and therefore, detailed description on each members of the light emitting device 200 shown in FIG. 2 will be omitted appropriately.

The base body 201 of Example 2 is further provided with the protruding portion 201c' at on the longer side on the inner surface of the side wall, in addition to the protruding portion 201c disposed at the curved portion at a shorter side as in the base body 101 of Example 1. In this example, integrally with the base body, the protruding portion 201c' is disposed on the inner surface of the side wall portion 201a of the base body and at a position close to the rising portion of the side wall portion 201a from the bottom portion 201b. The protruding portion 201c' is formed in a shape protruding into the recess S, in the same manner as the protruding portion 201c. With this arrangement, the area of connection at the bonding interface between the sealing member 204 filled in the recess S and the base body 201 can be further increased, and moreover, with the anchor effect of the protruding portion 201c and 201c', the sealing member 204 can be securely fixed in the recess. Particularly, in the example shown in FIG. 2A, the protruding portion 201c is disposed on each of the opposite curved surface portions, and the protruding portion 201c' is disposed on each of the flat surface portions between the opposite curved surface portions to increase the fixing points with the sealing member 204, and thus the reliability can be further increased.

Also, the light emitting device 200 has a bottom portion 201b which is integrally combined with a pair of side wall portions 201a defining the recess S at the bottom surface side of the base body 201, and has a protruding portion 201c' disposed above each of both ends of the bottom portion 201b. Specifically, each protruding portion 201c' is arranged at a location which is near the border between the facing conductive members 202 and the bottom portion 201b of the base body arranged therebetween, and which is near the corner portion where each conductive member 202 planarly contact with the side wall portion 201a at an approximately perpendicular angle. With the base body 201 having integrally formed protruding portions 201c' each of which protrudes inwardly from the side wall portion 201a of the recess S at a location near a corner portion of each conductive member 202 as described above, detachment between the conductive member 202 and the bottom portion 201b due to the difference in their thermal expansion coefficient can be effectively prevented.

This is obtained because the protruding portion 201c' increases the area of connection with the sealing member 204 that is filled in the recess S which allows firm connection with the sealing member 204 to be made. That is, detachment or separation of the sealing member 204 caused by an increase in the temperature or the like can be prevented by the protruding portion 201c'. As a result, the condition is in such that the sealing member 204 push a large area of the conductive members 202 and the bottom portion 201b downwards, and therefore, the adhesion can be maintained while preventing them disengaging from each other. Specifically, the bottom surface of the recess S is formed with the conductive members 201 and the bottom portion 201b of the base body which are made of different materials. Therefore, the protruding portion 201c' disposed in such region in close vicinity to their boundary region, that is at a lower region of the side wall portion 201a, can effectively obtain the effect described above, and thus, preferable.

The shape and the arrangement of the protruding portions 201c, 201' in Example 2 can be set as in the protruding portion 101c in Example 1. The protruding portions 101c, 201c, 201c' are preferably disposed on the side walls on both sides in the recess S, but they may be disposed on only one side of the side wall.

(Bottom Locking Depression 201f)

Further, in addition to the above, a locking structure for enhancing the adhesion with the sealing member may be provided not only to the side wall of the recess but also on the bottom portion, that is, the bottom surface of the base body. The locking structure is not limited to a protruding portion and a depression can be employed. At the bottom portion in particular, a depression is preferable due to the easiness of forming. For example, the depression can be easily formed by partially projecting a peel-off sheet toward the bottom portion 201b at the time of preparing the mold.

The light emitting device 200 shown in FIG. 2A has the bottom locking depression 201f at a part of the bottom portion 201b of the base body. The bottom locking depression 201f is as shown in the cross-sectional view in FIG. 2C, a region depressed into the bottom portion 201b of the base body. The bottom locking depression 201f is provided to partially reduce the thickness of the bottom portion 201b and not to penetrate the base body 201. Also, the bottom locking depression 201f is formed upwardly increasing tapering opening.

Providing such a depression allows the sealing member 204 to be filled in the recess S to form a non-flat connection interface with the bottom surface of the base body 201 in addition to the peripheral portion thereof, so that attaching of the resin can be improved and thus the strength of adhesion can be improved. With the depression in the bottom portion of the base body, the fixing of the sealing member can be enhanced even in a type where the protruding portion on the side wall is not provided.

The bottom locking depressions 201f shown in FIG. 2A to FIG. 2C each has an oval-shape opening in top view, but the shape is not specifically limited and a rectangular shape or a circular shape can be employed. The shape of the opening of the bottom locking depression 201f may be changed in its depth direction, for example, an oval shape at the upper side and a circular shape at the lower side. Also, the bottom locking depression 201f may be provided either as a single depression or as a plurality of depressions.

Figure 2D:
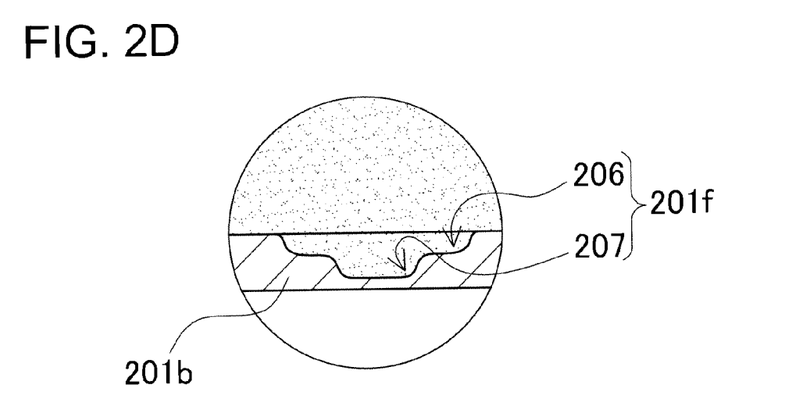
FIG. 2D is a partially enlarged view of a variant example of a depression.
Figure 2E:
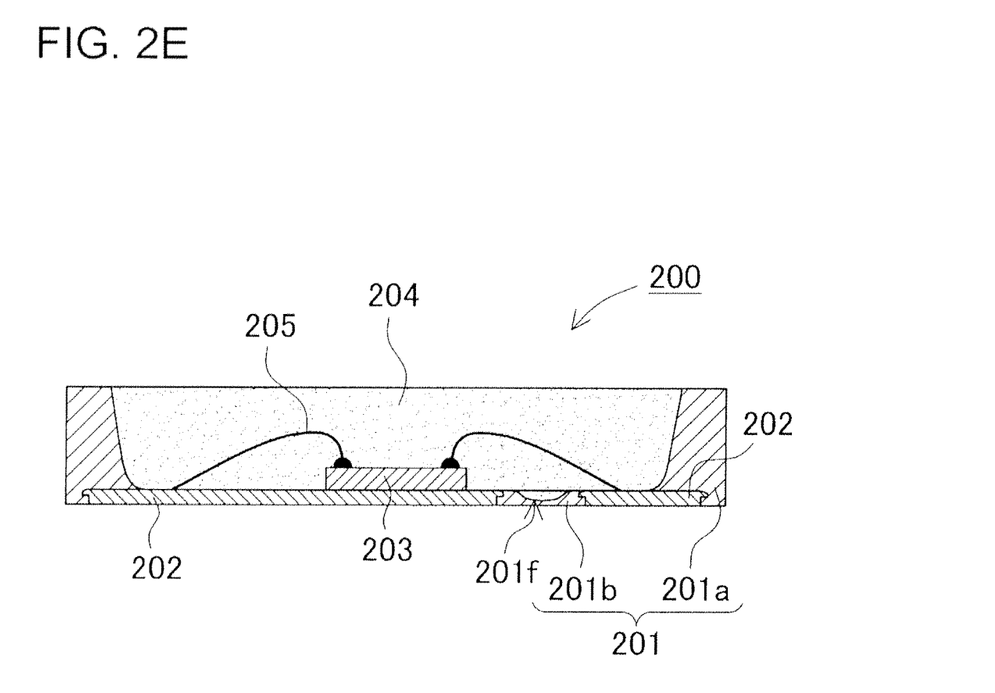
FIG. 2E is a an end elevation view of the light emitting device of FIG. 2A taken along the line IIC-IIC', depicting an embodiment in which a corner between a bottom surface and a side wall of a recess has a rounded shape.

Moreover, a further depression can be provided in a depression. Such a variant example is shown in the enlarged cross-sectional view in FIG. 2D. The bottom locking depression 201f shown in the figure is provided as a double recess in which the degree of depression is changed in the depth direction. The bottom locking depression 201f shown in FIG. 2D is provided such that the opening diameter of the bottom locking depression 201f is decreased stepwisely to form an approximately symmetrical step-like configuration in cross section. Specifically, the bottom locking depression 201f is provided with its opening diameter decreases in two steps. In detail, the first bottom depression 206 provided in the upper surface of the bottom portion 101b of the base body and having a first opening diameter and the second bottom depression 207 having a second opening diameter which is smaller then the first opening diameter are formed integrally in the depth direction. Providing the bottom locking depression 201f in the bottom portion 201b with the opening diameter decreasing in a multi-step manner enables the formation of the inner surface of the depression with a complex shape. As a result, the inner surface area of the bottom locking depression 201f can be increased, so that adhesion with the sealing member 204 filled in the recess can be further enhanced.

In Example 2, the inner surface of each of the first bottom depression 206 and the second bottom depression 207 is formed to be a curved surface, that is, a recess with curved contour with a rounded corner. This is preferable because such a rounded bottom locking depression 201f is easy to manufacture. The bottom locking depression 201f may be formed in a rectangular shape. The opening diameter of the bottom locking depression 201f may be reduced in three steps or more or gradually.

Further, in the light emitting device 200 provided with the bottom locking depression 201f of the base body in addition to the protruding portions 101c, 201c, 201c' of Example 1 and Example 2, adhesion with the sealing member 204 can be enhanced from multiple directions of the base body 201. That is, in the cases of FIG. 1 and FIG. 2, the inner wall surface of the base body is provided with an irregular portion with a protruding portion or a depression from three dimensional directions such as side wall surfaces of the shorter side and longer side and the bottom surface of the recess S, so that conforming the sealing member 204 to the irregular portion enables the anchor effect to be enhanced.

(Variant Example of Protruding Portion)

Figure 3:
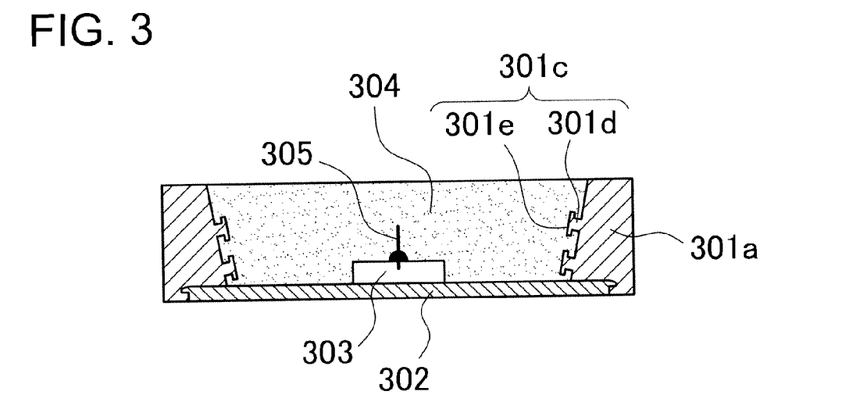
FIG. 3 is a partially enlarged view of a variant example of a protruding portion.

Further the examples shown in Example 1 and Example 2 illustrate the protruding portions protruding in the recess being formed in a truncated cone shape, but the shape of the protruding portion is not limited thereto and various shapes can be selected. Particularly in view of improving the anchor effect with the sealing member, the outer diameter near the tip of the protruding portion is preferably increased. A variant example thereof is shown in FIG. 3. The light emitting device shown in FIG. 3 is a variant example of the protruding portions 101c, 201c, and 201c' of Example 1 and Example 2, and the members other than the protruding portions are of the same as shown in FIG. 1 and FIG. 2. Therefore, each of the corresponding members is referenced by a numeral with the same last two digits and the description will be omitted appropriately. The protruding portion 301c shown in FIG. 3 is made with a mushroom shape having a cross section of approximately a T-shape, which has a stem portion 301d projecting approximately perpendicularly from the side wall portion 301a and a flat portion 301e at the tip of the stem portion 301d, extending in approximately perpendicular direction to the axis direction of the stem portion 301d. Due to its irregular shape, the protruding portion 301c having a T-shaped cross section can further enhance the adhesion with the sealing member 304. The contact area with the sealing member 304 is further increased, so that the adhesion with the sealing member 304 can be further enhanced, and thus preferable.

(Method of Manufacturing)

The method of manufacturing the light emitting device 200 of Example 2 is approximately the same as in the method of manufacturing the light emitting device 100 of Example 1, so that a detailed description on the same step will be omitted. Specifically, in the method of manufacturing of Example 2, the position of the opening provided in the mold release sheet which is described in the second step in the method in Example 1 will be specified as below. That is, the opening of the mold release sheet is provided at a position corresponding to an upper corner of the conductive member when the mold is assembled, and thus the protruding portion 201c' described above can be obtained.

In addition, a method of manufacturing the protruding portion in a T-shape in cross section will also be described below. The positions of forming the openings in the mold release sheet correspond, as in the mold in step 2, to the interval between a pair of conductive portions 202 which to constitute the bottom portion 201b of the base body, and to the boundary region with the space between the upper mold and the lower mold with which to form the side wall portion 201a of the base body. The pressure of injecting resin differs in the boundary region due to the difference in spatial volume between the respective injection regions. Particularly, in the mold, the narrow gap between the conductive members 202 and the boundary region with the wide space for forming the side wall portion are likely to be subjected to the stress due to the difference in the pressure and the flow speed of the resin, so that the resin tends to flow into the openings provided in such boundary regions. The resin flows through the opening in the mold release sheet and further flows in the gap between the mold release sheet and the mold and spreads. This spread forms the flat portion 301e of the protruding portion 301c, and the resin filled in the opening portion forms the stem portion 301d, respectively.

Thus, by adjusting the flow of the resin, for example, by increasing the stress of the resin by design, the flow of the resin to the opening portion of the mold release sheet can be increased, and further, by increasing the amount of the flow of the resin passing through the opening portion of the mold release sheet and the ratio of spread in the gap between the mold release sheet, the diameter of the flat portion 301e of the protruding portion 301c can be increased. Alternatively, vice versa can be performed, in which, the inflow pressure and/or inflow speed of the resin is adjusted to control the diameter and/or thickness of the protruding portion.

After the resin is cured, the protruding portion 301c is forced through the opening portion of the mold release sheet to remove the base body from the mold and the mold release sheet. Particularly, it is preferable that at the flat portion 301e having a larger diameter compared to the step portion 301d, the mold release sheet is stretched to increase the opening to allow the flat portion 301e to pass through.

Further, a method of forming the bottom locking depression 201f will be described below. At the time of assembling the mold in the second step described above, the mold release sheet is adjusted so as to be able to maintain its elasticity at a part at the lower surface of the bulging portion of the upper mold, where the mold release sheet is attached. Specifically, the elasticity of the mold release sheet at the disposing region of the conductive member 202 is maintained by setting the mold while adjusting the tightness of the mold release sheet at the gap of the mold, which is achieved by sucking the mold release sheet by a vacuum through the gap of the upper mold. Thereafter, the conductive member is interposed between the upper and lower molds to set, and a stress is applied to the mold release sheet of the upper mold. At this time, the elasticity of the mold release sheet is maintained at the disposed region of the conductive member 202, and the mold release sheet is firmly adhered the support substrate. Meanwhile, at the region for forming the bottom portion 201b of the base body, that is at the gap created between the mold and a pair of the conductive members 202, the mold release sheet which is deformed (stretched) by the pressure is pulled to the gap. That is, the mold release sheet having a width wider than the width of the gap between the pair of the conductive members is gathered in the gap, so that a sag occurs.

As a result, occurrence of sag of the mold release sheet at the disposed region of the conductive member 202 can be avoided, so that the adhesion between the conductive member 202 and the mold release sheet can be enhanced, and the resin can be prevented from flowing over the conductive member 202. At the same time, in the gap in the mold corresponding to the formation region of the bottom portion 201b of the base body, the upper surface thereof can be formed by the part of the sheet that is downwardly sagged, so that the resin can be formed conforming to this special configuration. That is, the bottom locking depression 201f of the base body can be obtained with the shape conforming to the shape of the loose of the resin sheet.

Further, forming the mold release sheet with a multi-layer, the bottom locking depression 201f formed with a plurality of bottom depressions as described above can be obtained. This is achieved by utilizing the properties of a multilayer sheet having elasticity, in which the layers in the multilayered sheet are detached by the stress exerted by the set of the mold. Each of the sheets have different elasticity with each other, so that the degree of respective downward looseness in the gap in the mold can be varied, and as a result, the bottom surface of each of the multilayer sheet can be formed with an irregular shape. That is, in a shape of the gap in the mold corresponding to the forming region of the bottom portion 201b of the base body, the upper surface side can be formed with a complicated shape in which an irregular shape is obtained by using a multilayer mold release sheet.

INDUSTRIAL APPLICABILITY

The light emitting device according to the present invention is of small-size and light weight, and excellent in light extraction efficiency and reliability, and can be obtained easily. These light emitting devices can be utilized in applications such as various indicators, lighting apparatus, displays, backlight light sources for liquid crystal displays, and further, digital video cameras, facsimiles, copiers, image reading systems in scanners or the like, and projector devices.

DENOTATION OF REFERENCE NUMERALS

100 . . . light emitting device
101 . . . base body, 101a . . . side wall portion of base body, 101b . . . bottom portion of base body, 101c . . . protruding portion
102 . . . conductive member
103 . . . light emitting element
104 . . . sealing member
105 . . . electrically-conductive wire
200 . . . light emitting device
201 . . . base body, 201a . . . side wall portion of base body, 201b . . . bottom portion of base body, 201c . . . protruding portion, 201c' . . . protruding portion, 201f . . . bottom locking depression
202 . . . conductive member
203 . . . light emitting element
204 . . . sealing member
205 . . . electrically-conductive wire
206 . . . first depression in the bottom surface
207 . . . second depression in the bottom surface
301a . . . side wall portion, 301c . . . protruding portion, 301d . . . stem portion, 301e . . . flat portion
302 . . . conductive member
303 . . . light emitting element
304 . . . sealing member
305 . . . electrically-conductive wire
S . . . recess

What is claimed is:

1. A light emitting device comprising:
a resin package comprising:
a base body having a bottom and a side wall that define a recess, the bottom and the side wall being integrally formed, and
a conductive member having an upper surface exposed at a bottom of the recess and a lower surface forming an outer surface, the upper surface of the conductive member being planar between lateral ends of the conductive member;
a light emitting element mounted in the recess; and
a sealing member disposed in the recess to cover the light emitting element,
wherein the side wall includes a portion disposed on the conductive member, said portion having a curved surface that extends continuously from the side wall to the upper surface of the conductive member to form a rounded corner at an intersection between the side wall and the upper surface of the conductive member.

2. The light emitting device according to claim 1, wherein a light emitting element is electrically connected with the conductive member via a conductive wire or a bump.

3. The light emitting device according to claim 1, wherein a thickness of the conductive member is from 25 μm to 500 μm.

4. A resin package comprising:
a base body having a bottom and a side wall that define a recess, the bottom surface and the side wall being integrally formed; and
a conductive member having an upper surface exposed at a bottom of the recess and a lower surface forming an outer surface, the upper surface of the conductive member being planar between lateral ends of the conductive member, wherein the side wall includes a portion disposed on the conductive member, said portion having a curved surface that extends continuously from the side wall to the upper surface of the conductive member to form a rounded corner at an intersection between the side wall and the upper surface of the conductive member.

5. The resin package according to claim 4, wherein a thickness of the side wall in a lateral direction parallel to the upper surface of the conductive member gradually increases from a top of the side wall to a bottom of the sidewall.

6. The resin package according to claim 4, wherein a depression is formed in the bottom of the base body.

7. The resin package according to claim 4, wherein:

the lower surface of the conductive member at a portion of the conductive member forming the recess is exposed outward from the resin package, and the lateral ends of the conductive member are disposed inside the side wall such that outer lateral sides of the side wall extend laterally outward beyond the lateral ends of the conductive member.

\* \* \* \* \*